United States Patent
Wundrak et al.

(10) Patent No.: US 10,386,437 B2
(45) Date of Patent: Aug. 20, 2019

(54) METHOD FOR GENERATING A RADIAL OR SPIRAL MRT IMAGE

(71) Applicant: DENTSPLY SIRONA inc., York, PA (US)

(72) Inventors: Stefan Wundrak, Gronau (DE); Volker Rasche, Erbach (DE)

(73) Assignee: DENTSPLY SIRONA Inc., York, PA (US)

( * ) Notice: Subject to any disclaimer, the term of this patent is extended or adjusted under 35 U.S.C. 154(b) by 14 days.

(21) Appl. No.: 15/517,282

(22) PCT Filed: Oct. 7, 2015

(86) PCT No.: PCT/EP2015/073107
§ 371 (c)(1),
(2) Date: Apr. 6, 2017

(87) PCT Pub. No.: WO2016/058876
PCT Pub. Date: Apr. 21, 2016

(65) Prior Publication Data
US 2017/0307711 A1 Oct. 26, 2017

(30) Foreign Application Priority Data
Oct. 7, 2014 (DE) .......................... 10 2014 220 328

(51) Int. Cl.
*G01R 33/56* (2006.01)
*G01R 33/561* (2006.01)
(Continued)

(52) U.S. Cl.
CPC ..... *G01R 33/5614* (2013.01); *G01R 33/4824* (2013.01); *G01R 33/56518* (2013.01)

(58) Field of Classification Search
CPC .......... G01R 33/5614; G01R 33/56518; G01R 33/4824
See application file for complete search history.

(56) References Cited

U.S. PATENT DOCUMENTS

| | | | |
|---|---|---|---|
| 4,721,312 A | 1/1988 | Kaufman | |
| 2015/0077112 A1* | 3/2015 | Otazo | A61B 5/055 324/318 |

(Continued)

FOREIGN PATENT DOCUMENTS

| | | |
|---|---|---|
| DE | 10337932 A1 | 3/2005 |
| WO | 2008132659 A2 | 11/2008 |
| WO | 2013159044 A1 | 10/2013 |

OTHER PUBLICATIONS

International Search Report dated Jul. 18, 2016.
(Continued)

*Primary Examiner* — Qian Yang
(74) *Attorney, Agent, or Firm* — Dentsply Sirona Inc.

(57) ABSTRACT

Disclosed herein is a method for generating an MRI image in which a radial or spiral k-chamber path with a constant angular increment Psi is used to take an MRI image, the angular increment Psi being in the angular range of between 5-55 degrees or being in the corresponding supplementary angle Psi' and is selected according to the formula $Psi_N$, $_M$=pi/(N+1/(M+tau−1)). Alternatively, for an angular increment Psi which deviates from the angle increment of the optimal distribution of n radial profiles $Psi_{opt}$=180°/n, the minimum scanning efficiency of the angular increment Psi for n>21 profiles is greater than 0.95, the angular increment Psi is in an angular range of 5° to less than 68.7537°, in particular between 5-55 degrees or in the corresponding supplementary angle Psi'. Compared to the arrangement of the radial or spiral profile using the golden angle of 111.24°, the angle increments calculated according to the above formula lead to lower eddy current artifacts, for example during the use of a b-SSFP-pulse sequence.

12 Claims, 3 Drawing Sheets

(51) Int. Cl.
  *G01R 33/48* (2006.01)
  *G01R 33/565* (2006.01)

(56) References Cited

U.S. PATENT DOCUMENTS

2015/0192653 A1* 7/2015 Sharif .................. A61B 5/055
    600/420
2016/0025829 A1* 1/2016 Koktzoglou ....... G01R 33/4824
    324/309

OTHER PUBLICATIONS

Brau Ac, Johnson GA: "The impact of view order on steady magnetization in radial sampling", Proceedings of the International Society for Magnetic Resonance in Medicine, ISMRM, 11th Scientific Meeting and Exhibition, Toronto, Canada, Jul. 10-16, 2003, Jun. 26, 2003 (Jun. 26, 2003), p. 296, XP040587635, the whole document.

Davide Piccini et al: "Spiral phyllotaxis: The natural way to construct a 3D radial trajectory in MRI", Magnetic Resonance in Medicine., vol. 66, No. 4, Apr. 5, 2011 (Apr. 5, 2011), pp. 1049-1056, XP055247046, US ISSN: 0740-3194, DOI: 10.1002/mrm.22898 Abschnitt "Theory".

Stefanie Winkelmann et al: "An Optimal Radial Profile Order Based on the Golden Ratio for Time-Resolved MRI", IEEE Transactions on Medical Imaging, IEEE Service Center, Piscataway, NJ, US, vol. 26, No. 1, Jan. 1, 2007 (Jan. 1, 2007), pp. 68-76, XP011152669, ISSN: )278-0062, DOI: 10.1109/TMI.2006.885337 Abschnitte II.A und II.D figures 1-3.

Wundrak Stefan et al: "A Small Surrogate for the Golden Angle in Time-Resolved Radial MRI Based on Generalized Fibonacci Sequences", IEEE Transactions on Medical Imaging, IEEE Service Center, Piscataway, NJ, US, vol. 34, No. 6, Jun. 1, 2015 (Jun. 1, 2015), pp. 1262-1269, XP011582649, ISSN: 0278-0062, DOI: 10.1109/TMI.2014.2382572 (retrieved on May 29, 2015), the whole document.

Tsai C-M et al: "Reduced aliasing artifacts using variable-density k-space sampling trajectories", Magnetic Resonance in Medicine, John Wiley & Sons, Inc, US, vol. 43, No. 3, Mar. 1, 2000 (Mar. 1, 2000), pp. 452-458, XP002179553, ISSN: 0740-3194, DOI: 10.1002/(SICI)1522-2594(200003)43:3<452::A ID-MRM18>3.0.CO;2-B.

* cited by examiner

| N | M | Psi$_{N,M}$ | $G_4^{N,M}$ | $G_5^{N,M}$ | $G_6^{N,M}$ | $G_7^{N,M}$ | $G_8^{N,M}$ | $G_9^{N,M}$ | Limits of $SE_{n>2N}^{Psi_{N,M}}$ |
|---|---|---|---|---|---|---|---|---|---|
| 1 | 1 | 111.2461...° | 3 | 5 | 8 | 13 | 21 | 34 | [ 0.973, 0.996 ] |
| 2 | 1 | 68.7538...° | 5 | 8 | 13 | 21 | 34 | 55 | [ 0.973, 0.996 ] |
| 3 | 1 | 49.7507...° | 7 | 11 | 18 | 29 | 47 | 76 | [ 0.972, 0.996 ] |
| 4 | 1 | 38.9776...° | 9 | 14 | 23 | 37 | 60 | 97 | [ 0.973, 0.997 ] |
| 5 | 1 | 32.0396...° | 11 | 17 | 28 | 45 | 73 | 118 | [ 0.973, 0.998 ] |
| 6 | 1 | 27.1984...° | 13 | 20 | 33 | 53 | 86 | 139 | [ 0.973, 0.998 ] |
| 7 | 1 | 23.6281...° | 15 | 23 | 38 | 61 | 99 | 160 | [ 0.973, 0.998 ] |
| 2 | 2 | 75.5678...° | 7 | 12 | 19 | 31 | 50 | 81 | [ 0.974, 0.996 ] |
| 2 | 3 | 79.0725...° | 9 | 16 | 25 | 41 | 66 | 107 | [ 0.974, 0.996 ] |
| 3 | 2 | 53.2235...° | 10 | 17 | 27 | 44 | 71 | 115 | [ 0.974, 0.996 ] |
| 3 | 3 | 54.9385...° | 13 | 23 | 36 | 59 | 95 | 154 | [ 0.974, 0.996 ] |
| 4 | 2 | 41.0775...° | 13 | 22 | 35 | 57 | 92 | 149 | [ 0.973, 0.996 ] |

METHOD FOR GENERATING A RADIAL OR SPIRAL MRT IMAGE

TECHNICAL FIELD

The disclosure relates to a method for creating an MRT image in which a radial k-space trajectory is used with a constant angle increment Psi.

BACKGROUND

The procedure for a normal imaging process can be summarized as follows: After positioning a patient in an MR tomograph, coils are positioned relative to the patient. The creation of a survey radiograph makes it possible to plan the image geometry in a workstation that interacts with the MR tomograph, and the k-space data are imaged. After the image reconstruction on a reconstruction computer, the images are displayed on the workstation for viewing and diagnosis by the viewer. Based upon this procedure, the invention relates to the imaging of the k-space data.

"Balanced Steady-State Free Precession" MRI sequences (also termed b-FFE, TrueFISP, or FIESTA [15]) are used for fast imaging, in order to obtain a higher signal-to-noise ratio, such as in comparison to FLASH sequences. Moreover, the b-SSFP sequence is used in order to obtain a fast T1/T2 contrast which, for example, is important in imaging the articular disc in the temporomandibular joint [23]. In comparison, FLASH can generate only T1 or proton-weighted contrast.

The k-space is sampled by a radial k-space trajectory that is composed of a plurality of radial profiles, of which each pass through the midpoint of the k-space [16]. Radial trajectories are less subject to movement artifacts and are therefore frequently used in order to image dynamic physiological processes [3].

In addition, radial trajectories, in comparison to Cartesian trajectories, are more robust with regard to incomplete sampling viewed in the direction of rotation, which is used for time-resolved imaging to improve the temporal resolution.

A reconstruction with a shiftable temporal section is used in order to further increase the refresh rate of the image. In conventional radial trajectories with a uniform distribution of the radial profiles, the size of the temporal section used for reconstruction is dictated by the number of profiles per image and must be selected before imaging. In most cases, the optimum size of the temporal section for reconstruction is unknown beforehand. Changing the size of the temporal section requires a re-imaging of the object with an adapted radial trajectory.

It was demonstrated in [33] that, in fact, when the radial profiles are arranged using the golden angle of 111.24 . . . ° so that the sequential profiles are spaced with the angle increment of the golden angle, a nearly even distribution of the profiles can be achieved for any number n of sequential profiles. This golden angle is the optimum arrangement, if the number n of radial profiles which is to be used for reconstructing an image is not constant, or is fixed before imaging [2]. Consequently, the number n of profiles in the reconstruction section, and hence the degree of undersampling, can be subsequently adapted to different degrees of movement.

For the sake of completeness, it is noted that, in the present application, the full circle is assumed to be Pi instead of 2*Pi, since the central beam trajectory is used in most sequences in MRI.

If the full circle in the golden section is divided (tau=(1+sqrt (5))/2, the golden angle $Psi_{golden}$=Pi/tau of 111.2461 . . . ° is obtained, along with the associated supplementary angle ("small golden angle") Pi-$Psi_{golden}$ of 68.7538 . . . °.

Due to the incoherent artifacts, the golden angle is used inter alia in combination with compressed sensing [5], as well as in WO 2013/159044 A1.

The combination of the golden angle arrangement with balanced SSFP is subject to disadvantages, since the large radial angle increment of 111.246° is achieved by a continuously and abruptly changing gradient scheme. This gradient scheme, in turn, induces large, abruptly changing eddy currents in the conductive parts of the main magnet, and therefore produces continuously changing inhomogeneities in the main magnet field. The eddy current effects influence the equilibrium of the balanced SSFP sequence and thereby produce strong image artifacts [1].

Bieri et al. propose two techniques to compensate for these artifacts [16]:
1. The k-space profiles are re-sorted so that two k-space profiles with the same or similar angle are always measured sequentially. This eliminates eddy current effects, and the equilibrium of the SSFP sequence is retained, which is also termed "spoke-pairing." However, the temporal resolution of the dynamic image is halved. A "spoke" is a synonym for a k-space profile; all k-space profiles together are the k-space trajectory.
2. The eddy-current-induced signal is suppressed by a small dephasing gradient which is aligned perpendicular to the slice position. This modifies the amplitude of the rephasing gradient ("through slice equilibration"). In practice, and when the angle increments are very large, this technique yields only unsatisfactory results, since the eddy currents that can be compensated for are limited. Moreover, this solution works only for two-dimensional images.

Alternatively, FLASH sequences are used that have a worse SNR and show a different contrast.

It is, moreover, desirable to find a constant angle increment Psi that achieves satisfactory uniformity for each number of n profiles. Given an angle increment of $Psi_{opt}$, the optimum distribution for an image with precisely n profiles is $Psi_{uniform}$=180°/n, since all of the gaps between the adjacent profiles are accordingly equal in size.

A uniform angle increment $Psi_{uniform}$=Pi/P offers the best uniform radial sampling trajectory for a given number P of radial profiles. If the number P of profiles is variable, it was revealed that the trajectory with the golden angle is an optimum radial distribution for a random number of profiles.

In order to compare sampling trajectories, the sampling efficiency is calculated. The quality of a non-optimum distribution is defined by the sampling efficiency. A high uniformity yields a high sampling efficiency. The sampling efficiency SE (Psi, P) for a given angle increment Psi and for P radial profiles corresponds to the relationship between the signal-to-noise ratio $SNR_{uniform}$ of uniform sampling and the signal-to-noise ratio $SNR_{Psi}$ of sampling with the angle increment Psi [17]. The signal-to-noise ratio SNR can be derived directly from the sampling density of the sampling scheme [3]. The sampling efficiency is defined as:

$$SE_P^\psi = \frac{SNR_\psi}{SNR_{uniform}} = \sqrt{\frac{\pi^2/P}{\sum_{i=0}^{P-1}(\Delta\Phi_i)^2}}$$

wherein $\Delta\Phi_i$ is the average azimuth distance of the profile "i" to its two neighbors. The sampling efficiency of the golden angle is greater than 0.9732 for each number of profiles P, termed "n" in the remainder of the text.

By means of the "pseudo golden-ratio spiral imaging" method, it is possible to generate real-time MRT images of a talking person with favorable image quality and simultaneously acceptable sound quality [37].

From WO 2008/132659 A2, a device and a method are known for generating MRT images of a patient, wherein the k-space trajectories follow a so-called "Periodically Rotated Overlapping Parallel Lines with Enhanced Reconstruction" approach [38].

SUMMARY

The object of the present disclosure is to be able to use a b-SSFP sequence even when the number of radial profiles to be used for reconstructing an image is not constant, or is uncertain before imaging, in order, for example, to obtain a fast T1/T2 contrast, which is, for example, important in imaging the articular disc in the temporomandibular joint. Image artifacts which are caused by eddy currents are thereby suppressed as much as possible.

DESCRIPTION

According to the present disclosure, in a method for creating a dynamic MRI image in which a radial k-space trajectory is used with a constant angle increment Psi, where the MRI sequence is executed according to the fully balanced SSFP method, the angle increment Psi lies within an angular range of 5 to 55° or the corresponding supplementary angle, and is chosen according to the formula $Psi_{N,M}=pi/(N+(1/(M+tau-1)))$, $$\psi_{N,M} = \frac{\pi}{N + \dfrac{1}{M+\tau-1}}$$

wherein N is from 3 to 35 and M is from 1 to 5, and wherein $tau=(1+sqrt(5))/2$. For tau, the following accordingly also applies: $1/tau=tau-1$.

Because N is from 3 to 35, it ensures that neither the golden angle nor the complementary golden angle are contained.

The angle increment $Psi_1$, is the known golden angle, $Psi_2$ is the angle complementary to the golden angle known as the small golden angle, and, according to the present disclosure, $Psi_N$ with N>2 is a series of decreasing irrational angle increments with optimum properties in fully balanced SSFP that are similar to the golden angle. The abbreviation $Psi_1$ stands for $Psi(1,1)$, and $Psi_2$ stands for $Psi(2,1)$, i.e., for M=1.

Advantageously, M=1 and N can be at least 3, so that the following formula results for the angle increment Psi: $Psi_{N,M}=Pi/(tau+N-1)$:

$$\psi_N = \frac{\pi}{\tau + N - 1}$$

Advantageously, M=1 and N can be at least 3, so that the following formula results for the angle increment Psi: $Psi_{N,M}=Pi/(tau+N-1)$:
wherein N is from 3 to 35, and wherein $tau=(1+sqrt(5))/2$.

For the combination with fully balanced SSFP, the angles that are less than the golden angle and the smaller golden angle are advantageous when they more or less have the same properties with regard to sampling efficiency when there is a variable number of profiles P.

The present disclosure uses a $Psi_N$ that is small enough so that no image artifacts arise in the fully balanced SSFP.

There are many suboptimum small angles that possess sufficiently favorable properties with regard to sampling efficiency when there is a variable number of profiles P.

According to another advantageous development, the angle increment results when M=2 and N is at least 3.

Advantageously, the angle increment is determined by N being at least 5, and preferably at least 7. This yields a sufficiently small angle for b-SFFP imaging in most situations. The disadvantage of a larger N is that the sampling efficiency is only acceptable starting with the second rotation, which can be formulated as the condition P>2N. With a large N, a large minimum window width accordingly results for the reconstruction. In an example where N=30, this would be at least 60 radial profiles for reconstruction, which is a great deal in applications such as compressed sensing and parallel imaging. An optimum N is therefore as small as possible, yet large enough so that no artifacts occur. N=7 is a good compromise.

Advantageously, a number n of profiles can be selected for image reconstruction, wherein the number n is a part of a modified Fibonacci sequence $G^{N,M}$ with:

$$G^{N,M}_1=1+(M-1)N, G^{N,M}_2=N, G^{N,M}_n=G^{N,M}_{n-1}+G^{N,M}_{n-2}$$

The advantage is that the sampling frequency constitutes a local optimum at these points.

Another subject of the disclosure is a method for creating a dynamic MRI image in which a radial k-space trajectory is used with a constant angle increment Psi, wherein the MRI sequence is executed according to the method of fully balanced SSFP when an angle increment Psi deviates from the angle increment of the optimum distribution of n radial profiles $Psi_{opt}=180°/n$, and the minimum sampling efficiency of the angle increment Psi for n>21 is greater than 0.95, advantageously greater than 0.97. The angle increment Psi lies within an angular range of 5 to less than 68.7537 degrees, and, in particular, from 5 to 55 degrees or the corresponding supplementary angle.

This ensures that image artifacts are suppressed to a sufficient degree, and that a suitable image quality can be provided.

The minimal sampling efficiency for a different number of n profiles for the golden angle $Psi_1=111.246$, and the minimum sampling efficiency for a smaller golden angle such as $Psi_7=23.628\ldots$ possess the same lower boundary starting at a minimum number of profiles $n_{min}$. The same holds true for all $Psi_N$ and for any size N.

Advantageously, the angle increment Psi can be selected such that the minimum sampling efficiency of the angle increment Psi for n>21 profiles is greater than 0.97.

A reconstruction of images—in particular, into a 3-D data set—is accomplished using a gridding method or a filtered back projection method.

Before the reconstruction, k-space data can be corrected with regard to a gradient-induced phase error by using complementary phase information of pairs of opposing, or nearly opposing, radial profiles.

Advantageously, at least two profiles can be measured per angle position, which is also termed spoke-pairing, in order to achieve a further reduction in eddy-current-induced image artifacts.

Advantageously, a T1/T2 or proton density mapping sequence can be used for imaging, to determine the relaxation parameters within a single image.

The method is particularly advantageous when the MRI image is dynamic, since the temporal reconstruction window can be retrospectively adapted to the specific speed of movement of the physiology, such as the heart rate.

Advantageously, the MRI sequence can be executed using the fully balanced SSFP method, since this achieves a higher signal-to-noise ratio, and this sequence is beneficial in imaging the articular disc in the temporomandibular joint due to the T1/T2 contrast.

Advantageously, a plurality of coils can be used in imaging, and images can be reconstructed using a method based upon parallel imaging. A lower sampling density of the k-space can therefore be used, without causing aliasing artifacts in the reconstructed image.

Moreover, images can be reconstituted using a method based upon compressed sensing.

It is particularly advantageous in the evaluation of images when residual eddy current artifacts are further reduced by a "through-slice equilibration" method, in order to increase image quality.

The basic concept of the disclosure is to use small angles with similarly favorable properties of the golden angle, which—particularly in combination with a b-SSFP sequence for dynamic imaging—reduce the image artifacts in comparison to using the golden angle. Image artifacts, which before had been generated by quickly changing eddy currents caused by the change in angle with the large golden angle, are avoided by using smaller angle increments.

In embodiments, new angle increments are proposed which are derived from a generalized Fibonacci sequence. In comparison to the golden angle, these reduced golden angles have similar properties, which renders these angle increments advantageous for dynamic MRI in conjunction with fully balanced SSFP sequences.

BRIEF DESCRIPTION OF THE DRAWING

The method according to the present disclosure will be explained in reference to the drawing. The figures show.

EXEMPLARY EMBODIMENT

Figures 1, 2:
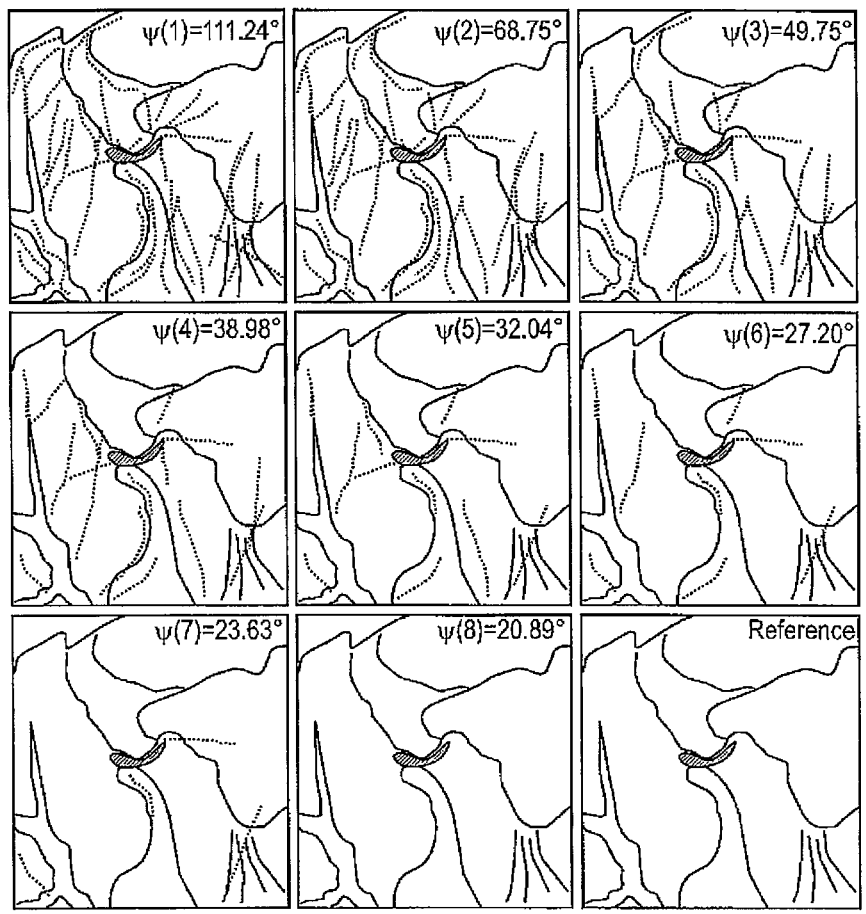
FIG. 1 A table with angle increments Psi according to the invention for M=1, 2, or 3 and N=3-7.
FIG. 2 A dynamic image of a temporomandibular joint with a b-SSFP sequence with angles $Psi_1$ to $Psi_8$ and a reference image.

FIG. 1 shows a table with angle increments Psi according to the invention for M=1 and N=3-7, yielding angle increments according to the invention $Psi_3$ to $Psi_7$ of 49.75 . . . ° to 23.6281 . . . °.

The angle increments are irrational; in the specific implementation of the invention, a numeric approximation is used, however. Additional angle increments $Psi_N$ are:

| $Psi_N$ | N |
|---|---|
| 20.886434218636708... | 8 |
| 18.714843408803084... | 9 |
| 16.952290809269876... | 10 |
| 15.493154880963477... | 11 |
| 14.265296809351289... | 12 |
| 13.217766980806575... | 13 |
| 12.313557359254249... | 14 |
| 11.525138191507267... | 15 |
| 10.831606200941504... | 16 |
| 10.216803992712247... | 17 |
| 9.668045514836129... | 18 |
| 9.175231325586566... | 19 |
| 8.730221324604273... | 20 |
| 8.326381580011979... | 21 |
| 7.958251370987027... | 22 |
| 7.621294815891128... | 23 |
| 7.311713034528165... | 24 |
| 7.026300303881501... | 25 |
| 6.762332637943018... | 26 |
| 6.517480573502168... | 27 |
| 6.289740241092741... | 28 |
| 6.077378399537631... | 29 |
| 5.878888241685868... | 30 |
| 5.692953586679246... | 31 |
| 5.518419658955621... | 32 |
| 5.354269082488171... | 33 |
| 5.199602035704745... | 34 |
| 5.053619749390260... | 35 |

For selected values of M>1, in this case M=2 and N=3, 4 angle increments $Psi_{2,3}$=53.2235 . . . and 41.0775 . . . result. For M=3 and N=4, an angle increment $Psi_{3,3}$ of 54.9385 . . . results Moreover, e.g., the following angle increments result for M=2 and N=5-11:

| $Psi_{N,M}$ | N, M |
|---|---|
| 33.445027267682470 . . . | 5, 2 |
| 28.204474872272382 . . . | 6, 2 |
| 24.383748140492692 . . . | 7, 2 |
| 21.474675482864956 . . . | 8, 2 |
| 19.185744201605331 . . . | 9, 2 |
| 17.337756625763216 . . . | 10, 2 |
| 15.814491083709555 . . . | 11, 2 |

FIG. 2 shows a dynamic image of a temporomandibular joint with a b-SSFP sequence with the known angle increments $Psi_1$ and $Psi_2$, and a reference image with an angle Psi=1°, as well as with the angle increments $Psi_3$ to $Psi_8$ according to the invention.

It is evident that the artifacts with decreasing angle increments $Psi_1$ to $Psi_8$ are negligible, and an acceptable image quality is reached starting with angle increment $Psi_6$. The articular disc is easily visualized due to the b-SSFP T1/T2 contrast.

Figure 3:
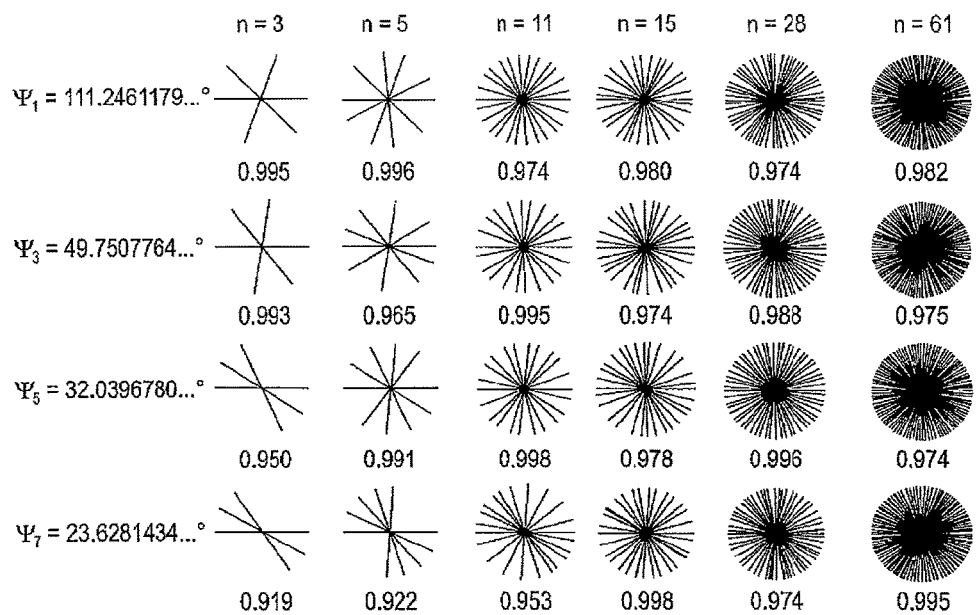
FIG. 3 The distribution of radial profiles P=3, 5, 11, 15, 28, and 61 for angle increments $Psi_N$ where N=1, 3, 5, and 7, and the sampling efficiency SE.

FIG. 3 shows the distribution of radial profiles P=3, 5, 11, 15, and 28 for angle increments $Psi_N$ where N=1, 3, 5, and 7, and contains the associated sampling efficiency SE under each distribution; accordingly, a sampling efficiency SE of 0.974 results for $Psi_5$ at n=61 profiles.

Figure 4:
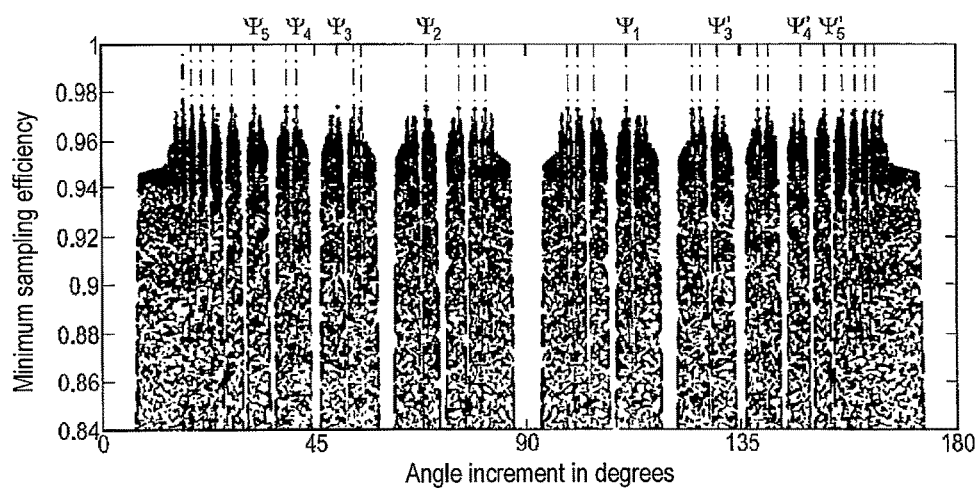
FIG. 4 The distribution of the minimum sampling efficiency SE over an angle range of 180°.

FIG. 4 shows the minimum sampling efficiency SE as a numeric simulation. The minimum sampling efficiency SE between 0.84 and 1.00 is depicted on the Y-axis, and the angle Psi from 0 to 180° with a resolution of 0.002° is depicted on the X-axis. The minimum sampling efficiency was determined for each angle over the range n=(21; 10^4) (number of profiles). The angle increments $Psi_1$ to $Psi_5$ and the supplementary angles $Psi_{3'}$ to $Psi_{5'}$ are indicated, as well as other suitable angles which are indicated by interrupted lines extending to the top edge. The thick, uninterrupted lines correspond to angle increments $Psi_N$, wherein each of these angle increments has secondary maxima $Psi_{N,M}$ depicted by the thinner uninterrupted lines. The diagram is symmetrical to 90°, so that the supplementary angles $Psi_3$ to $Psi_5$, are discernible.

Figure 5:
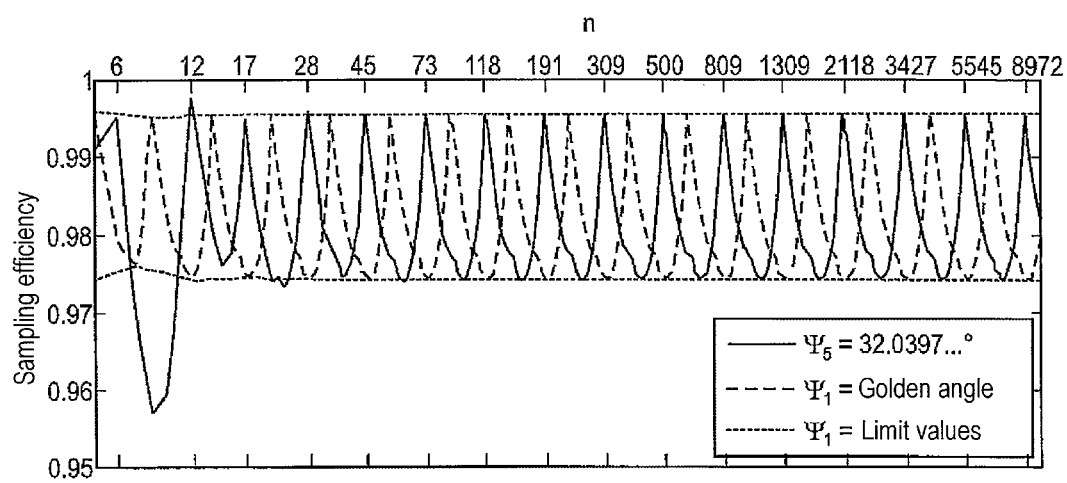
FIG. 5 The sampling efficiency SE for $Psi_5$ in comparison to the angle increment of the golden angle.
Figure 6:
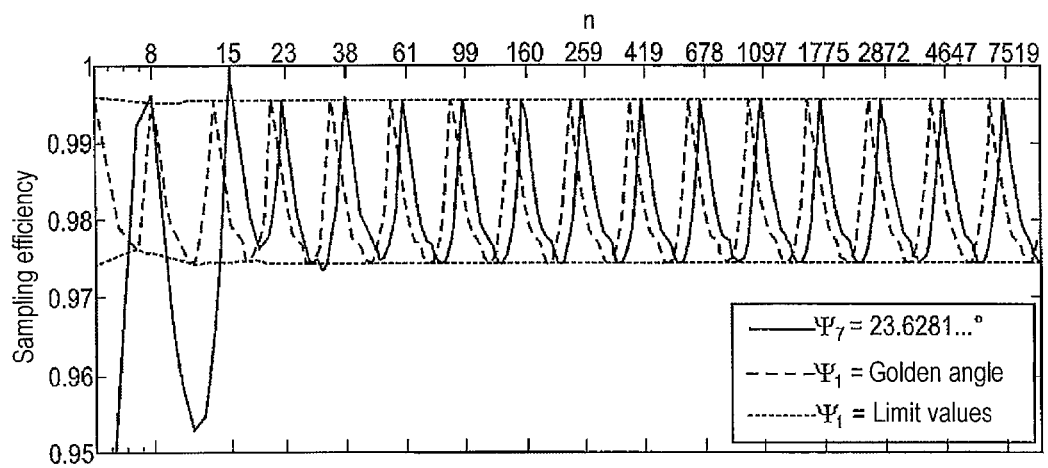
FIG. 6 The sampling efficiency SE for $Psi_7$ in comparison to the angle increment of the golden angle.

FIGS. 5 and 6 depict the sampling efficiency SE for $Psi_5$ and $Psi_7$ in comparison with the angle increments of the golden angle $Psi_1$=111.246 . . . . A logarithmic scale is used on the X-axis for the number of profiles n. The maximum sampling efficiency SE is achieved when n is from the modified Fibonacci sequence $G^{N,M}$ [19].

In this sequence, the following values of n result for M=1 and N=1 and 5:

$G^{1,1}$: 1 1 2 3 5 8 13 21 . . . .
$G^{5,1}$: 1 5 6 11 17 28 45 73 . . . .

It is discernible that for n>2N profiles, the sampling efficiency SE essentially lies between the limit values of the golden angle. For $Psi_5$, this is the case starting with n=11; for $Psi_7$, this is the case starting with n=15.

Glossary

Supplementary angle (English: adjacent angle)
Two angles are termed supplementary angles (or adjacent angles) when they add up to 180° (see http://de.wikipedia.org/wiki/Winkel#Supplementwinkel oder Ergänz ungswinkel)

$\psi'N,M=\pi-\psi N,M$

Each angle generates exactly the same profile distribution as the matching supplementary angle Psi'. This consequently also yields the symmetry with 90° in FIG. 4.

Compressed Sensing MRI

Compressed sensing [34] is capable of reconstructing the original signal from a small number of measurements that detect random linear combinations of the signal, even when the number of measurements is much less than specified by the Nyquist rate. One possibility of a semi-random sampling of the k-space are radial k-space trajectories with an angle increment that corresponds to the golden angle. With these trajectories and a nonlinear reconstruction algorithm, the methods of compressed sensing can be used for fast MRI imaging [4].

Parallel Imaging

In the parallel imaging method, the signal is combined from a plurality of coil elements that are arranged in a phased array. Together with the previously determined intensity profiles of the coils, this additional data can then be used to eliminate undersampling artifacts during reconstruction. Known algorithms are based upon either image space (SENSE) or k-space (GRAPPA), or a combination of both methods. By means of the subsampling that this enables, a significant acceleration of MR imaging can be achieved. The combination with compressed sensing [4] and the golden angle enables further acceleration of imaging.

Quantitative Relaxation Parameter Determination

Inversion recovery sequences consist of an inversion coil in combination with a balanced SSFP sequence, and enable the simultaneous quantification of the relaxation parameters T1, T2 and relative proton density. The combination with a radial k-space trajectory and the golden angle increment enables the relaxation parameter to be determined within a single image [35].

Model-Based Image Reconstruction

In addition to the methods of parallel imaging, compressed sensing, and quantitative relaxation parameter determination, the described radial profile arrangement can be combined with other components of model-based image reconstruction, such as by including B0 maps or trajectory maps [36].

REFERENCES

[1] P. C. Lauterbur, "Image Formation by Induced Local Interactions," Nature, vol. 242, no. 190, 1973.
[2] V. Rasche, R. de Boer, D. Holz, and R. Proksa, "Continuous radial data acquisition for dynamic MRI," Magn Reson Med., vol. 34, no. 5, pp. 754-61, 1995.
[3] S. Winkelmann, T. Schaeffter, T. Koehler, H. Eggers, and O. Doessel, "An optimal radial profile order based on the Golden Ratio for time-resolved MRI," IEEE transactions on medical imaging, vol. 26, no. 1, pp. 68-76, January 2007.
[4] L. Feng, R. Grimm, K. Tobias Block, H. Chandarana, S. Kim, J. Xu, L. Axel, D. K. Sodickson, and R. Otazo, "Golden-angle radial sparse parallel MRI: Combination of compressed sensing, parallel imaging, and golden-angle radial sampling for fast and flexible dynamic volumetric MRI," Magnetic resonance in medicine, vol. 72 (2014), pp. 707-717.
[5] A. J. Hopfgartner, O. Tymofiyeva, P. Ehses, K. Rottner, J. Boldt, E.-J. Richter, and P. M. Jakob, "Dynamic MRI of the TMJ under physical load," Dento maxillo facial radiology, vol. 42, no. 9, January 2013.
[6] J. Liu, P. Spincemaille, N. C. F. Codella, T. D. Nguyen, M. R. Prince, and Y. Wang, "Respiratory and cardiac self-gated free-breathing cardiac CINE imaging with multiecho 3D hybrid radial SSFP acquisition," Magnetic resonance in medicine, vol. 63, pp. 1230-7, May 2010.
[7] J. Paul, E. Divkovic, S. Wundrak, P. Bernhardt, W. Rottbauer, H. Neumann, and V. Rasche, "High-resolution respiratory self-gated golden angle cardiac MRI: Comparison of self-gating methods in combination with k-t SPARSE SENSE," Magnetic Resonance in Medicine, January 2014.
[8] A. D. Scott, R. Boubertakh, M. J. Birch, and M. E. Miguel, "Adaptive Averaging Applied to Dynamic Imaging of the Soft Palate," Magnetic resonance in medicine, vol. 70, pp. 865-874, 2013.
[9] H. K. Song and L. Dougherty, "k-space weighted image contrast (KWIC) for contrast manipulation in projection reconstruction MRI," Magnetic resonance in medicine, vol. 44, no. 6, pp. 825-32, December 2000.
[10] M. Doneva, "Advances in Compressed Sensing for Magnetic Resonance Imaging," Dissertation, Lubeck 2011.
[11] M. Usman, D. Atkinson, F. Odille, C. Kolbitsch, G. Vaillant, T. Schaeffter, P. G. Batchelor, and C. Prieto, "Motion Corrected Compressed Sensing for Free-Breathing Dynamic Cardiac MRI," Magnetic resonance in medicine, vol. 70, pp. 504-516, 2013.
[12] M. Doneva, H. Eggers, J. Rahmer, P. B̈ornert, and A. Mertins, "Highly Undersampled 3D Golden Ratio Radial Imaging with Iterative Reconstruction," in Proc. Intl. Soc. Mag. Reson. Med., vol. 16, 2008, p. 336.
[13] M. Lustig, D. L. Donoho, J. M. Santos, and J. M. Pauly, "Compressed Sensing MRI," Signal Processing Magazine, IEEE, vol. 25, no. 2, pp. 72-82, 2008.
[14] R. W. Chan, E. A. Ramsay, E. Y. Cheung, and D. B. Plewes, "The Influence of Radial Undersampling Schemes on Compressed Sensing Reconstruction in Breast MRI," Magnetic resonance in medicine, vol. 67, pp. 363-377, 2012.
[15] A. Oppelt, R. Graumann, H. Barfuss, H. Fischer, W. Hartl, and W. Schajor, "FISP—a new fast MRI sequence," Electromedia, vol. 54, pp. 15-18, 1986.
[16] O. Bieri, M. Markl, and K. Scheffler, "Analysis and Compensation of Eddy Currents in Balanced SSFP," Magnetic resonance in medicine, vol. 54, pp. 129-137, 2005.
[17] C. M. Tsai and D. G. Nishimura, "Reduced aliasing artifacts using variable-density k-space sampling trajectories," Magnetic resonance in medicine, vol. 43, pp. 452-458, March 2000.
[18] C. Marzec and J. Kappraff, "Properties of Maximal Spacing on a Circle Related to Phyllotaxis and to the Golden Mean," Journal of Theoretical Biology, vol. 103, pp. 201-226, 1983.
[19] A. F. Horadam, "A Generalized Fibonacci Sequence," Amer. Math. Monthly, vol. 69, no. 8, pp. 455-459, 1961.
[20] D. E. Knuth, The Art of Computer Programming, Vol 3. p. 543, Palo Alto, Calif.: Addison-Wesley, 1973.
[21] L. E. Dickson, History of the Theory of Numbers, Vol. 1: Divisibility and Primality. New York: Dover, 2005.
[22] S. Vajda, Fibonacci and Lucas Numbers, and the Golden Section—Theory and Applications. Chichester, England: Ellis Horwood Limited, 1989.
[23] S. Zhang, N. Gersdorff, and J. Frahm, "Real-Time Magnetic Resonance Imaging of Temporomandibular Joint Dynamics," The Open Medical Imaging Journal, vol. 5, pp. 1-7, 2011.
[24] A. Haase, D. Matthaei, W. Hänicke, and K.-D. Merboldt, "FLASH imaging. Rapid NMR imaging using low flip-angle pulses," Journal of Magnetic Resonance, vol. 67, pp. 258-266, 1986.
[25] V. Rasche, R. Proska, R. Sinkus, P. Börnert, and H. Eggers, "Resampling of Data Between Arbitrary Grids Using Convolution Interpolation," IEEE transactions on medical imaging, vol. 18, no. 5, pp. 385-392, 1999.
[26] V. Rasche, D. Holz, and R. Proksa, "Multi-Gradient-Echo (prMGE) MRI," Magnetic resonance in medicine, vol. 42, pp. 324-334, 1999.
[27] L. I. Rudin, S. Osher, and E. Fatemi, "Nonlinear total variation based noise removal algorithms," vol. 60, pp. 259-268, 1992.
[28] S. J. Scrivani, D. a. Keith, and L. B. Kaban, "Temporomandibular disorders," The New England Journal of Medicine, vol. 359, no. 25, pp. 2693-705, December 2008.
[29] K. P. Pruessmann, M. Weiger, M. B. Scheidegger, and P. Boesiger, "SENSE: sensitivity encoding for fast MRI." Magnetic resonance in medicine, vol. 42, no. 5, pp. 952-962, November 1999.
[30] M. A. Griswold, P. M. Jakob, R. M. Heidemann, M. Nittka, V. Jellus, J. Wang, B. Kiefer, and A. Haase, "Generalized autocalibrating partially parallel acquisitions (GRAPPA)," Magnetic resonance in medicine, vol. 47, no. 6, pp. 1202-1210, June 2002.
[31] S. Wundrak, J. Paul, J. Ulrici, E. Hell, and V. Rasche, "Sparse Dynamic MRI of the Temporomandibular Joint," Proc. Intl. Soc. Mag. Reson. Med., vol. 9, no. 1, 2014, p. 1267.
[32] S. Winkelmann, T. Schaeffter, H. Eggers, T. Nielsen, and O. Doessel, "Single Shot T1-Mapping, using a Radial Look-Locker Sequence and an optimal Profile Order determined by the Golden Cut," Proc. Intl. Soc. Mag. Reson. Med., 2005, p. 2196.
[33] Markl, M., & Leupold, J., "Eddy current compensation with N-average SSFP imaging," U.S. Pat. No. 7,372,266 B2, (2008).
[34] Donoho, D. L., Santos, J. M., & Pauly, J. M., "Compressed Sensing MRI," IEEE Signal Processing Magazine, 2008, (http://www.eecs.berkeley.edu/~mlustig/CS/CSMRI.pdf).
[35] Ehses, P., Seiberlich, N., Ma, D., Breuer, F. a, Jakob, P. M., Griswold, M. a, & Gulani, V., "IR TrueFISP with a golden-ratio-based radial readout: fast quantification of T1, T2, and proton density," Magnetic Resonance in Medicine, 69(1), 71-81, 2013.
[36] Fesssler, J. A., "Model-based image reconstruction for MRI," IEEE Signal Processing Magazine, 27(4), 81-89, 2010.
[37] Y.-C. Kim et al., "Pseudo golden-ratio spiral imaging with gradient acoustic noise cancellation: application to ral-time MRI of fluent speech," Proc. Intl. Soc. Mag. Reson. Med. 20, 2012, p. 4209.
[38] H. Eggers et al., "Magnetic resonance device and method," WO 2008/132659 A2, 2008.

The invention claimed is:
1. A method for generating an MRI image comprising generating an MRI image utilizing a radial or spiral k-space path with a constant angle increment Psi, wherein the angle increment Psi lies within the angular range of 5 to 55 degrees or the corresponding supplementary angle Psi', and is selected according to the formula $Psi_{N,M}=pi/(N+1/(M+tau-1))$,

$$\psi_{N,M} = \frac{\pi}{N + \dfrac{1}{M + \tau - 1}}$$

wherein N and M are arbitrary integer parameters, and
wherein N lies from about 3 to about 35, and
wherein M lies from about 1 to about 5, and wherein $tau=(1+sqrt(5))/2$.

2. The method according to claim 1, wherein M=1 and N is at least 3, so that the following formula $Psi_N=pi/(tau+N-1)$ results in the angle increment Psi:

$$\psi_N = \frac{\pi}{\tau + N - 1}.$$

3. The method according to claim 2, wherein N is at least 5.
4. The method according to claim 1, wherein M=2.
5. The method according to claim 1, further selecting a number n of profiles for further reconstruction processing, wherein the number n is a part of a modified Fibonacci sequence $G^{N,M}$ with:

$$G^{N,M}_1 = 1+(M-1)N, G^{N,M}_2 = N, G^{N,M}_n = G^{N,M}_{n-1} + G^{N,M}_{n-2}.$$

6. The method according to claim 1, wherein at least two profiles are measured per angle position.
7. The method according to claim 1, wherein residual eddy current artifacts are reduced by a "through-slice equilibration" method.
8. The method according to claim 1, wherein a T1-/T2- or a proton density mapping sequence is used for imaging.
9. The method according to claim 1, wherein the MRI image is dynamic.

10. The method according to claim 1, wherein the MRI sequence is executed according to a method of "fully balanced SSFP".

11. The method according claim 1, wherein a plurality of coils can be used in imaging, and images can be reconstructed using a method based upon parallel imaging.

12. The method according to claim 1, further comprising reconstructing images using a method based upon compressed sensing.

* * * * *